(12) United States Patent
Yuan et al.

(10) Patent No.: US 12,457,698 B2
(45) Date of Patent: Oct. 28, 2025

(54) BEARING CASE AND SPLICING DISPLAY DEVICE

(71) Applicants: BOE MLED Technology Co., Ltd., Beijing (CN); BOE TECHNOLOGY GROUP CO., LTD., Beijing (CN)

(72) Inventors: Jiaxing Yuan, Beijing (CN); Shipeng Wang, Beijing (CN); Jianbai Tan, Beijing (CN); Jianfeng Wang, Beijing (CN)

(73) Assignees: BOE MLED Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/025,676

(22) PCT Filed: Jun. 16, 2022

(86) PCT No.: PCT/CN2022/099117
§ 371 (c)(1),
(2) Date: Mar. 10, 2023

(87) PCT Pub. No.: WO2023/240526
PCT Pub. Date: Dec. 21, 2023

(65) Prior Publication Data
US 2024/0292549 A1    Aug. 29, 2024

(51) Int. Cl.
*H05K 5/00* (2025.01)
*H05K 5/02* (2006.01)

(52) U.S. Cl.
CPC .................................. *H05K 5/0217* (2013.01)

(58) Field of Classification Search
CPC ....... H05K 5/0217; G09F 9/30; G09F 9/3026; G09F 9/33
See application file for complete search history.

(56) References Cited

U.S. PATENT DOCUMENTS

| | | | | |
|---|---|---|---|---|
| 8,801,264 | B2* | 8/2014 | Huang | G02F 1/133308 |
| | | | | 362/382 |
| 10,613,305 | B2* | 4/2020 | Jia | G02F 1/133524 |
| 10,635,381 | B2* | 4/2020 | Nakano | G09F 9/3026 |
| 11,335,219 | B2* | 5/2022 | Kim | G02F 1/133308 |
| 11,573,613 | B2* | 2/2023 | Mori | G06F 1/1601 |
| 11,796,159 | B2* | 10/2023 | Liu | F21V 7/28 |

(Continued)

FOREIGN PATENT DOCUMENTS

| | | |
|---|---|---|
| CN | 202939920 U | 5/2013 |
| CN | 109935167 A | 6/2019 |

(Continued)

*Primary Examiner* — Rockshana D Chowdhury
(74) *Attorney, Agent, or Firm* — HOUTTEMAN LAW LLC

(57) ABSTRACT

The present disclosure provides a bearing case, including: a case body configured to bear a plurality of sub-display panel components; and at least one seam adjustment structure component, and each seam adjustment structure component corresponds to two adjacent sub-display panel components, is connected to the case body, and is configured to adjust a width of a splicing seam between the corresponding two adjacent sub-display panel components. Embodiments of the present disclosure further provide a splicing display device.

14 Claims, 10 Drawing Sheets

(56) References Cited

U.S. PATENT DOCUMENTS

| | | | | |
|---|---|---|---|---|
| 12,112,087 | B2* | 10/2024 | Peng | G06F 3/1446 |
| 2018/0173036 | A1* | 6/2018 | Kim | G02F 1/133524 |
| 2019/0239364 | A1* | 8/2019 | Heo | H05K 5/30 |
| 2019/0277377 | A1* | 9/2019 | Heo | G09F 9/33 |
| 2020/0068726 | A1* | 2/2020 | Hwang | E05C 19/16 |
| 2020/0103068 | A1* | 4/2020 | Ahn | F16M 11/043 |
| 2021/0004192 | A1* | 1/2021 | Kamiike | H05K 5/0217 |
| 2021/0076115 | A1* | 3/2021 | Choi | H04R 1/028 |
| 2021/0259118 | A1* | 8/2021 | Drabant | F21V 19/00 |
| 2022/0058988 | A1* | 2/2022 | Su | G09F 9/3026 |
| 2022/0157207 | A1* | 5/2022 | Yoon | G02F 1/133314 |
| 2023/0240108 | A1* | 7/2023 | Kim | G09F 9/3026 |
| 2023/0247784 | A1* | 8/2023 | Cho | H05K 5/0217 |
| | | | | 361/807 |
| 2023/0393612 | A1* | 12/2023 | Hemiller | G09F 19/226 |
| 2024/0371300 | A1* | 11/2024 | Park | G09F 9/3026 |

FOREIGN PATENT DOCUMENTS

| | | | |
|---|---|---|---|
| CN | 110307451 | A | 10/2019 |
| CN | 211928967 | U | 11/2020 |
| CN | 214410557 | U | 10/2021 |
| CN | 113597149 | A | 11/2021 |
| CN | 215643475 | U | 1/2022 |
| CN | 114545685 | A | 5/2022 |

* cited by examiner

BEARING CASE AND SPLICING DISPLAY DEVICE

CROSS-REFERENCE TO RELATED APPLICATION

This is a National Phase Application filed under 35 U.S.C. 371 as a national stage of PCT/CN2022/099117, filed on Jun. 16, 2022, the contents of which are incorporated herein by reference in their entirety.

TECHNICAL FIELD

The present disclosure relates to the display field, and in particular, to a bearing case and a splicing display device.

BACKGROUND

A large display screen is generally formed by splicing a plurality of sub-display panel components in a matrix, and images displayed by all of the sub-display panel components are combined to form a whole image of the large display screen.

After the sub-display panel components are spliced and fixed on a bearing case, a distance between adjacent sub-display panel components needs to be adjusted. In the adjustment process, it is required that a collision between the adjacent sub-display panel components should be prevented to avoid a damage, and it is also required that a width of a splicing seam between the adjacent sub-display panel components should be prevented from being so large that a display effect is influenced.

In the related art, to adjust the distance between adjacent sub-display panel components, generally, one sub-display panel component is manually separated from the bearing case at first, and then the sub-display panel component is re-aligned and fixed at a corresponding position of the bearing case, thereby achieving adjustment of the distance between the sub-display panel component and the sub-display panel component adjacent thereto. However, in such method of adjusting the distance, the sub-display panel component needs to be detached frequently, which can easily cause collisions between the sub-display panel components and thus cause damages, resulting in reduction of a yield.

SUMMARY

In order to solve at least one of the technical problems in the related art, the present disclosure provides a bearing case and a splicing display device.

In a first aspect, embodiments of the present disclosure provide a bearing case, including:
a case body configured to bear a plurality of sub-display panel components; and
at least one seam adjustment structure component each corresponding to two adjacent sub-display panel components, wherein each seam adjustment structure component is connected to the case body, and is configured to adjust a width of a splicing seam between the corresponding two adjacent sub-display panel components.

In some embodiments, each of the plurality of sub-display panel components includes: a display substrate and a fixing frame, and the display substrate is fixed on a side of the fixing frame;

the case body includes a bottom plate and a supporting structure, the supporting structure is located on a side of the bottom plate, and is configured to bear the plurality of sub-display panel components, and the bottom plate is disposed opposite to the plurality of sub-display panel components; and the seam adjustment structure component is located on the bottom plate and is configured to be able to contact with fixing frames in the corresponding two adjacent sub-display panel components, so as to adjust a distance between the fixing frames in the corresponding two adjacent sub-display panel components.

In some embodiments, the seam adjustment structure component is configured to be capable of moving along a normal direction of the bottom plate, being inserted into space between the fixing frames in the corresponding two adjacent sub-display panel components, and contacting with outer sidewalls of the fixing frames in the corresponding two adjacent sub-display panel components.

In some embodiments, the seam adjustment structure component includes: an ejector rod including: a rod body and an insertion portion, the rod body penetrates through the bottom plate, and the insertion portion is fixed at an end of the rod body close to the sub-display panel components;
a cross section of the insertion portion parallel to the bottom plate has an area gradually increasing along a direction approaching the rod body; and
part of an outer sidewall of the insertion portion is configured to be in contact with the outer sidewalls of the fixing frames in the corresponding two adjacent sub-display panel components.

In some embodiments, a cross section of the insertion portion perpendicular to the bottom plate is in the shape of an isosceles trapezoid.

In some embodiments, a shape of the insertion portion is a cone, a quadrangular pyramid, a truncated cone, or a truncated quadrangular pyramid.

In some embodiments, the seam adjustment structure component further includes: an insertion positioning structure, and a first limiting groove is formed in the bottom plate at a position corresponding to the seam adjustment structure component, and is configured to accommodate the insertion positioning structure and limit the insertion positioning structure at different depths; and
a via hole is formed at a bottom of the first limiting groove, the rod body penetrates through the via hole, and the insertion positioning structure is connected to an end of the rod body away from the insertion portion.

In some embodiments, the ejector rod further includes: a limiting portion fixed at the end of the rod body away from the insertion portion;
the seam adjustment structure component further includes: an elastic member; and
the elastic member has one end connected to the limiting portion and the other end connected to the bottom of the first limiting groove.

In some embodiments, the insertion positioning structure includes an adjusting screw, and an internal thread matching an external thread of the adjusting screw is formed on an inner sidewall of the first limiting groove.

In some embodiments, the adjusting screw has a diameter ranging from 3 mm to 5 mm, and a length ranging from 4 mm to 6 mm; and the ejector rod has a length ranging from 8 mm to 12 mm.

In a second aspect, the embodiments of the present disclosure provide a splicing display device, including: a plurality of sub-display panel components and the bearing case provided in the first aspect.

In some embodiments, one or more seam adjustment structure components are provided for two adjacent sub-display panel components.

In some embodiments, any two adjacent sub-display panel components are provided with a corresponding seam adjustment structure component.

In some embodiments, one seam adjustment structure component is provided for the two adjacent sub-display panel components, and the seam adjustment structure component is located at a middle position between the fixing frames in the corresponding two adjacent sub-display panel components.

In some embodiments, a magnet is disposed on an outer sidewall of each fixing frame, and the fixing frames in the two adjacent sub-display panel components attract each other through magnets.

In some embodiments, part of the outer sidewall of the fixing frame in each sub-display panel component configured to contact with the insertion portion of the corresponding seam adjustment structure component is a slope, and a slope angle of the slope is an acute angle.

DETAIL DESCRIPTION OF EMBODIMENTS

Figure 1A:
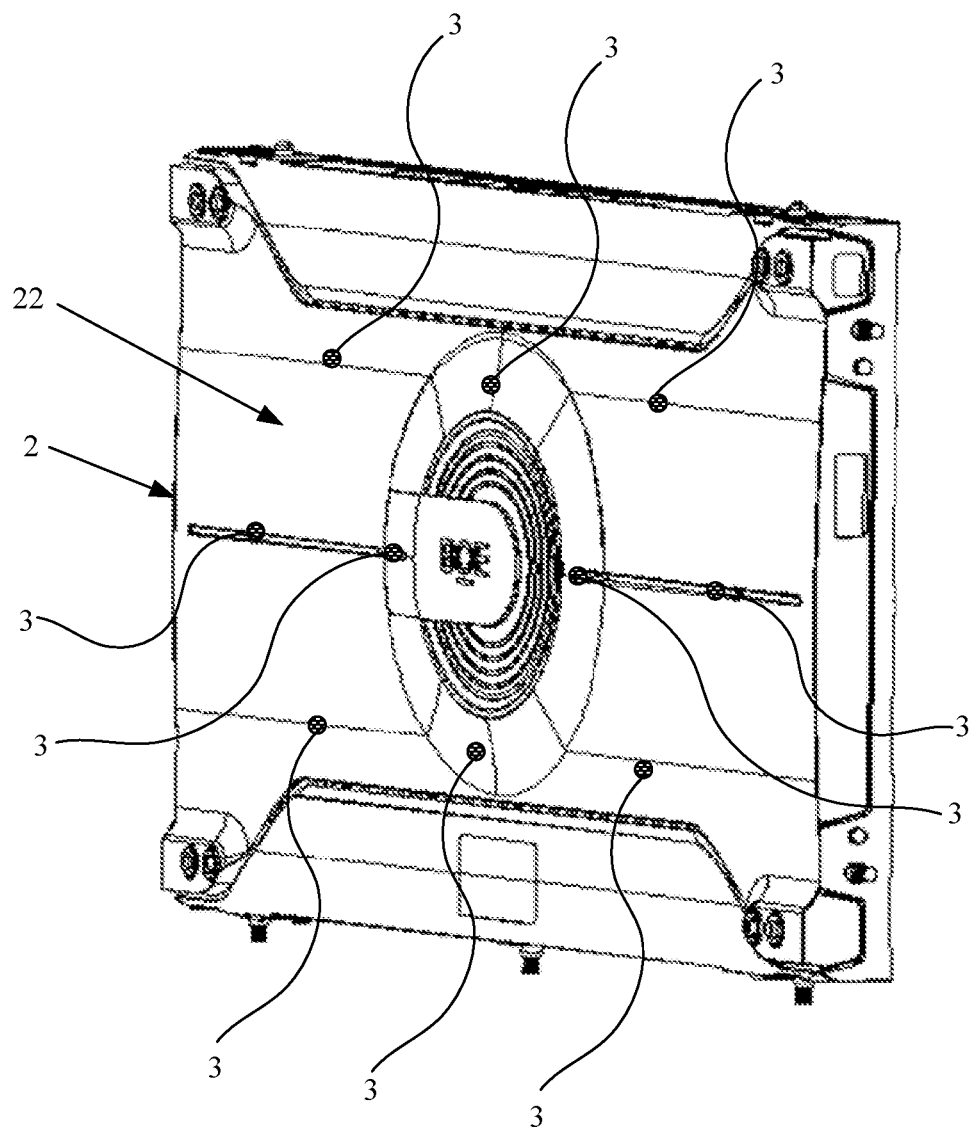
FIG. 1A is a schematic structural diagram of a bearing case according to the embodiments of the present disclosure.

In order to enable those of ordinary skill in the art to better understand the technical solutions of the present disclosure, the present disclosure will be described in detail below with reference to the accompanying drawings and specific embodiments.

The present disclosure will be described in detail below with reference to the drawings. In the drawings, the same element is denoted by the same reference numeral. For the purposes of clarity, elements in the drawings are not true to scale. Moreover, some well-known parts may not be shown in the drawings.

Many specific details of the present disclosure, such as structures, materials, dimensions, treating processes and techniques of elements, are given in the following description for enabling a clear understanding of the present disclosure. However, as understood by those of ordinary skill in the art, the present disclosure may be implemented without those specific details.

Figure 1B:
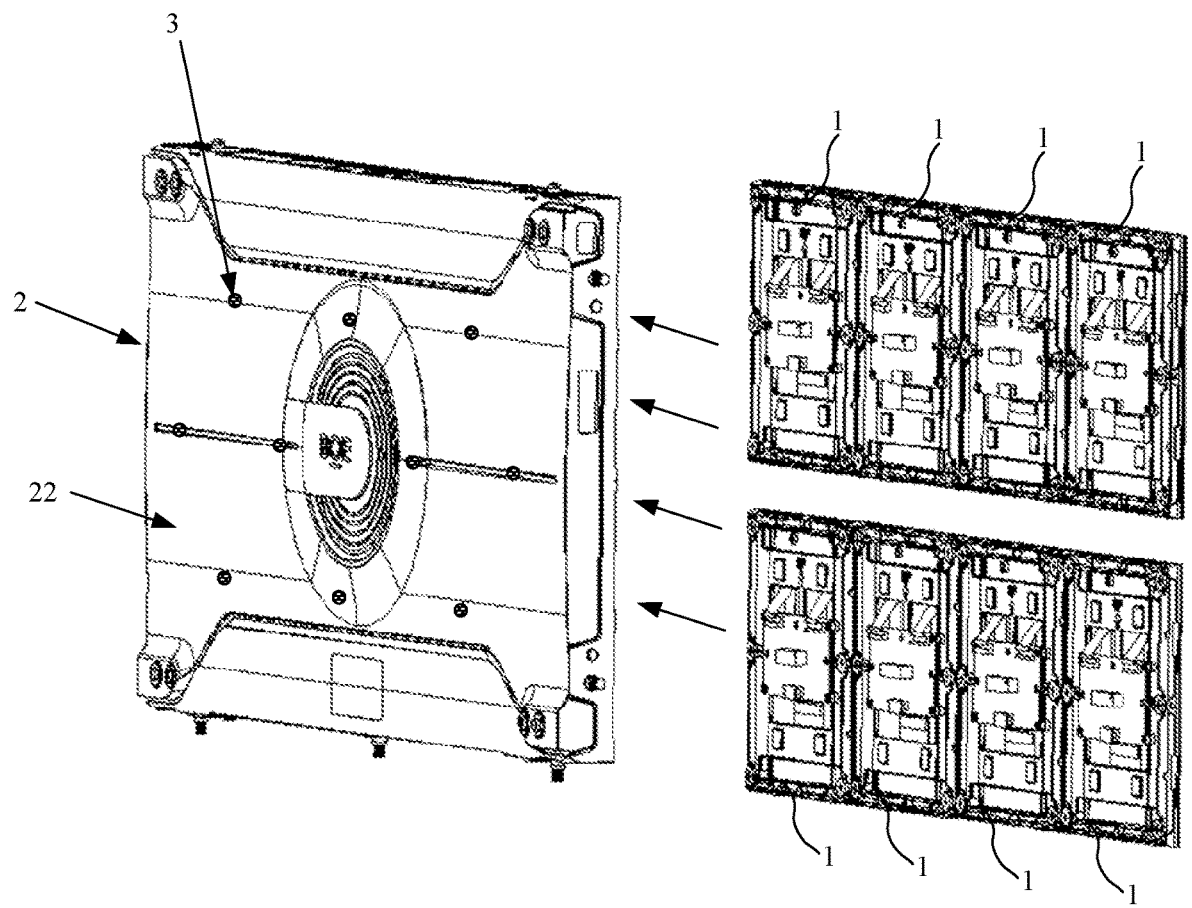
FIG. 1B is a schematic structural diagram of a bearing case and sub-display panel components before assembly according to the embodiments of the present disclosure.
Figure 2:
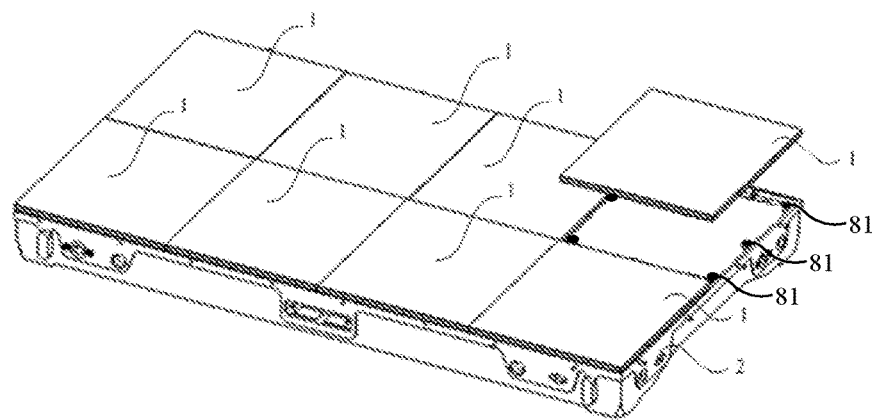
FIG. 2 is a schematic structural diagram of a splicing display device according to the embodiments of the present disclosure.
Figure 3:
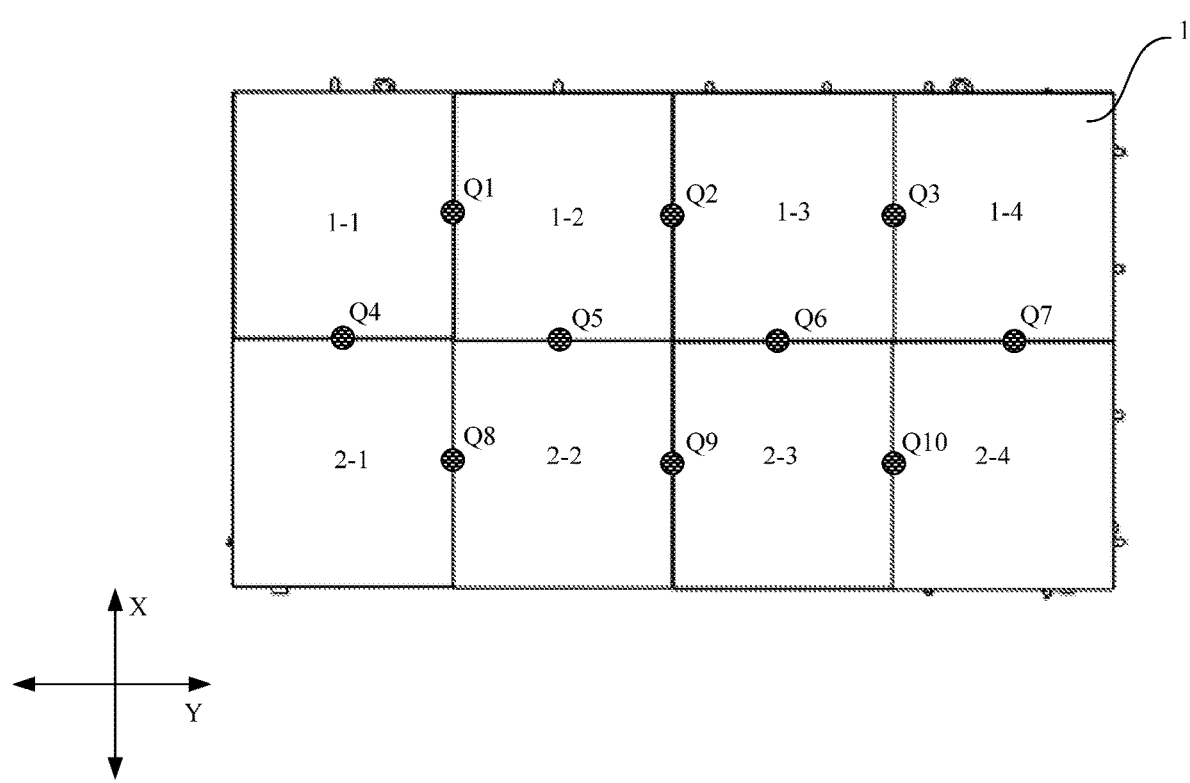
FIG. 3 is a top view of a splicing display device according to the embodiments of the present disclosure.

FIG. 1A is a schematic structural diagram of a bearing case according to the embodiments of the present disclosure. FIG. 1B is a schematic structural diagram of a bearing case and sub-display panel components before assembly according to the embodiments of the present disclosure. FIG. 2 is a schematic structural diagram of a splicing display device according to the embodiments of the present disclosure. FIG. 3 is a top view of a splicing display device according to the embodiments of the present disclosure. As shown in FIGS. 1 to 3, the bearing case includes: a case body 2, and at least one seam adjustment structure component 3.

The case body 2 is configured to bear a plurality of sub-display panel components 1; and each seam adjustment structure component 3 corresponds to two adjacent sub-display panel components 1, is connected to the case body 2, and is configured to adjust a width of a splicing seam between the corresponding two adjacent sub-display panel components 1.

In the embodiments of the present disclosure, the width of the splicing seam between the corresponding two adjacent sub-display panel components 1 can be adjusted by the seam adjustment structure component 3 on the case body 2, and there is no need to detach the sub-display panel components 1 from the bearing case during the whole adjustment process, so that a problem that the sub-display panel components 1 collide and are thus damaged can be effectively avoided, thereby reducing a cost of a splicing display device, and increasing a yield of the splicing display device. Meanwhile, splicing precision of the corresponding two adjacent sub-display panel components 1 can be improved through the adjustment by the seam adjustment structure component 3, which facilitates improving display performance of the splicing display device.

Figure 4:
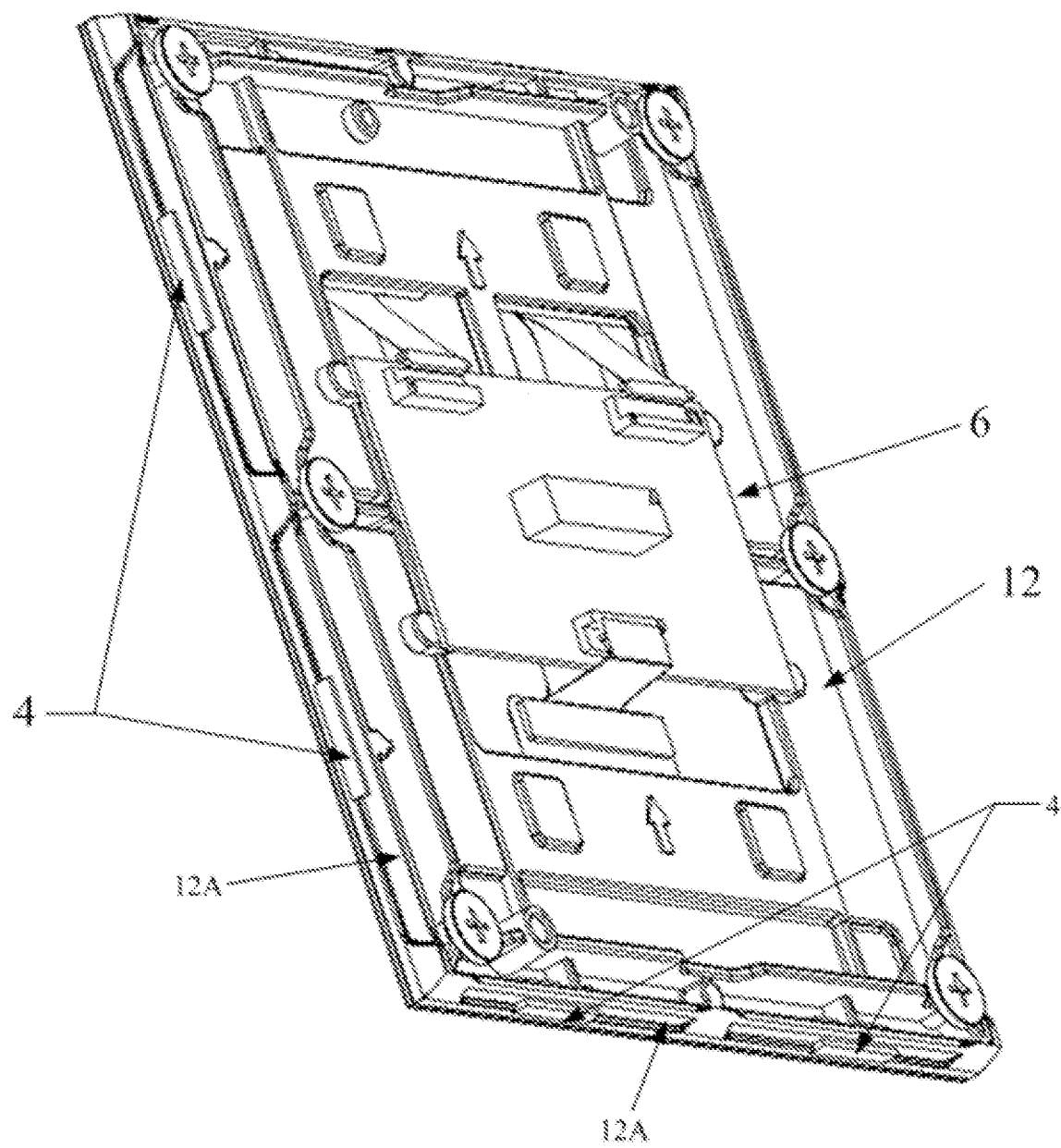
FIG. 4 is a schematic structural diagram of a sub-display panel component according to the embodiments of the present disclosure.
Figure 5:
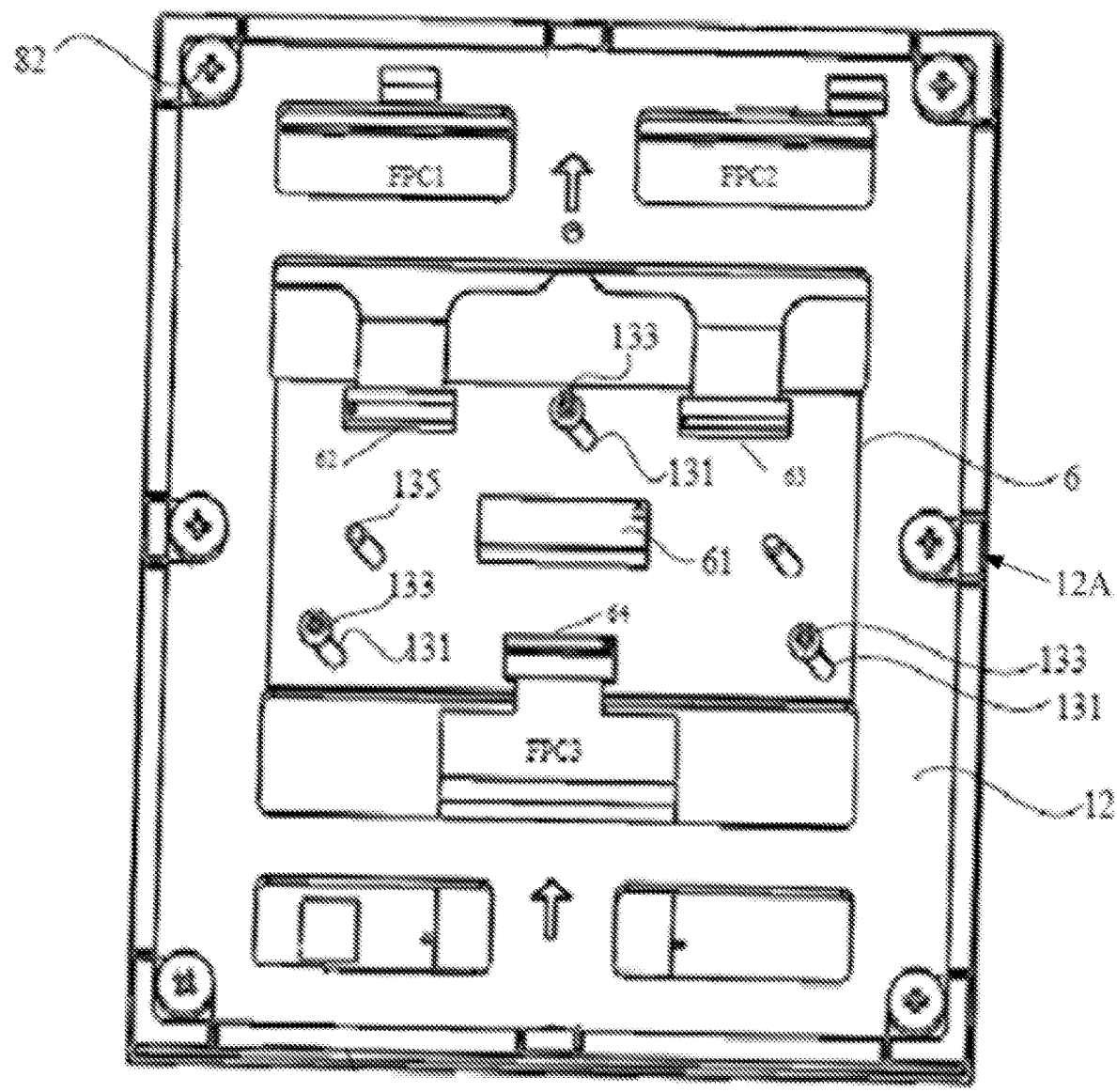
FIG. 5 is a top view of a sub-display panel component according to the embodiments of the present disclosure.
Figure 6:
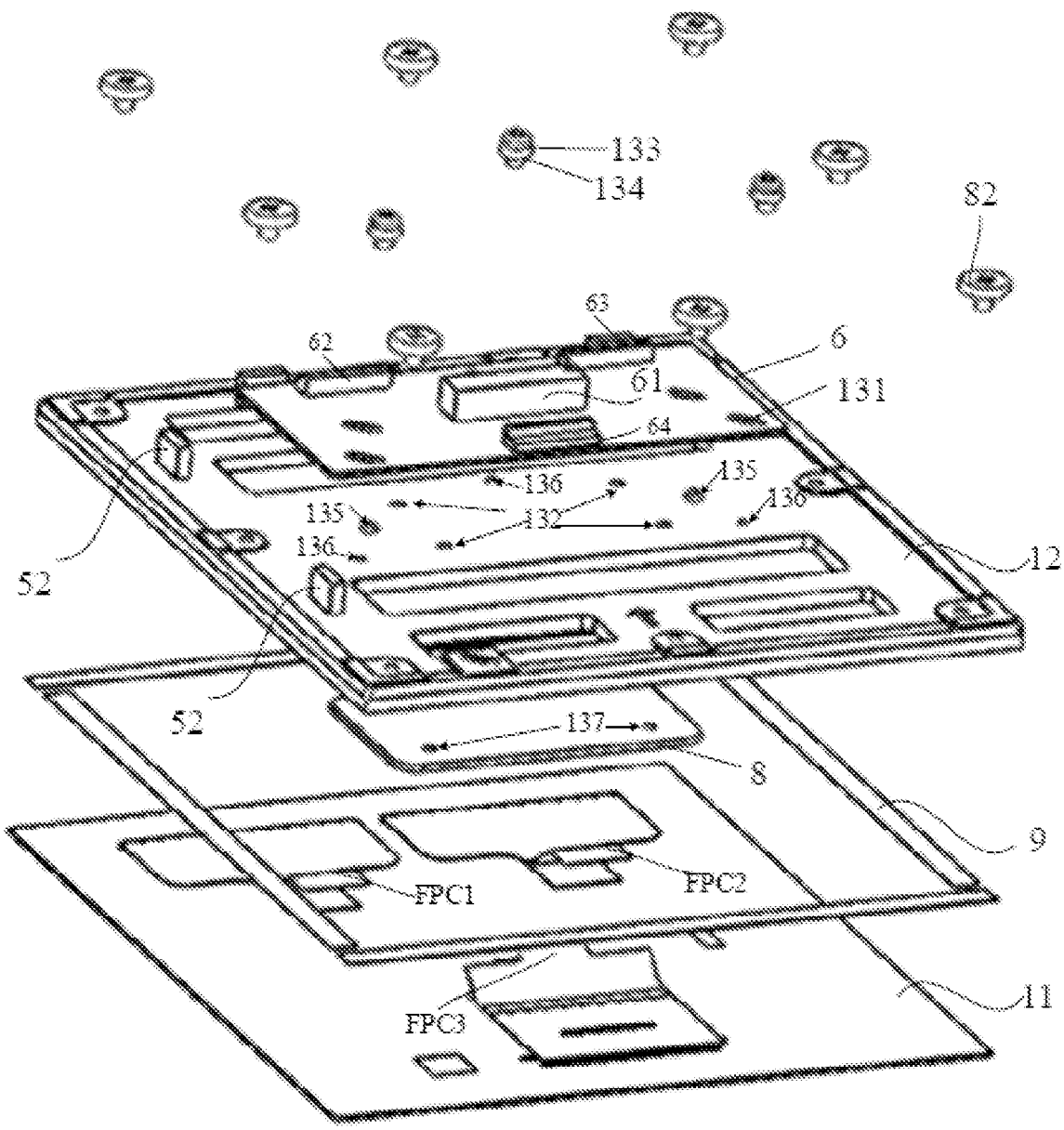
FIG. 6 is a schematic exploded view of a structure of a sub-display panel component according to the embodiments of the present disclosure.
Figure 7:
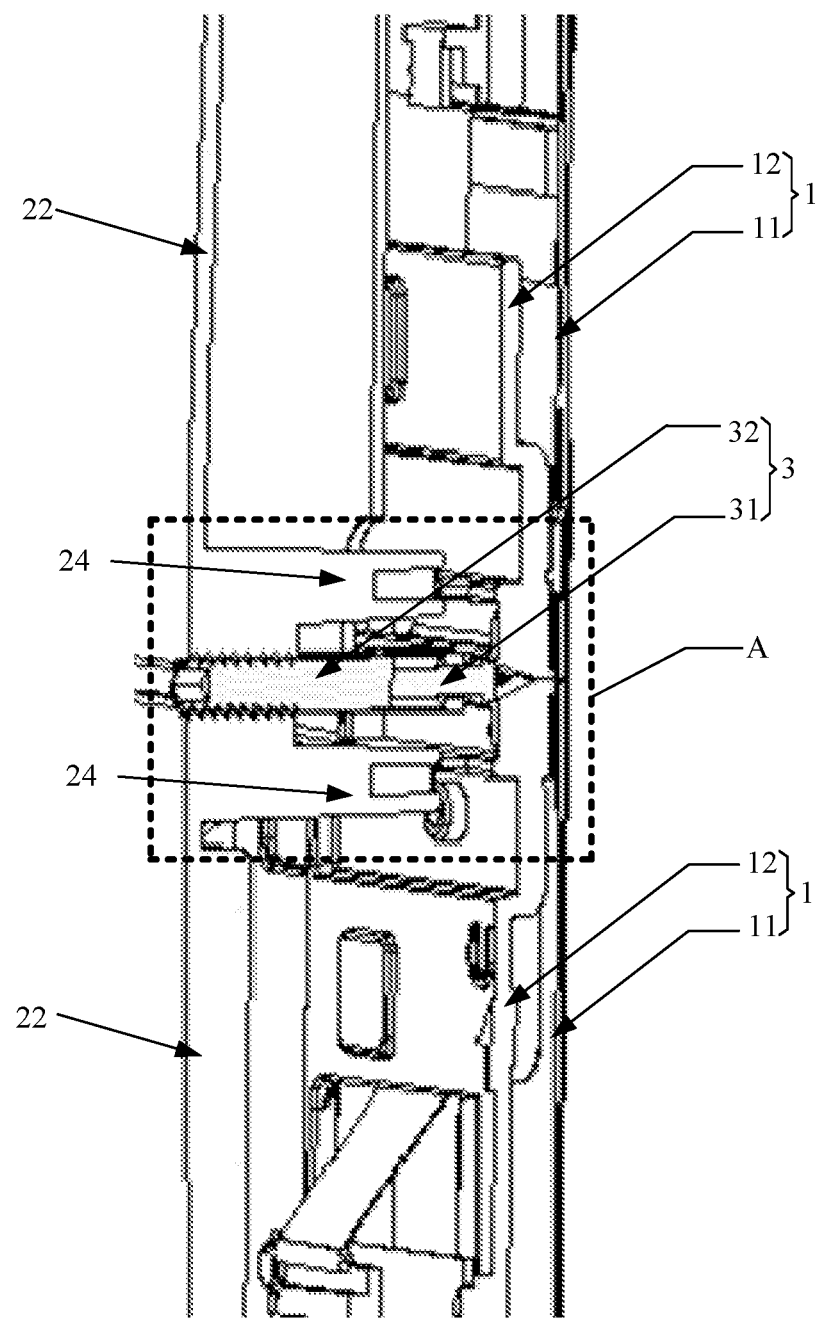
FIG. 7 is a schematic cross-sectional view of a seam adjustment structure component according to the embodiments of the present disclosure.
Figure 8:
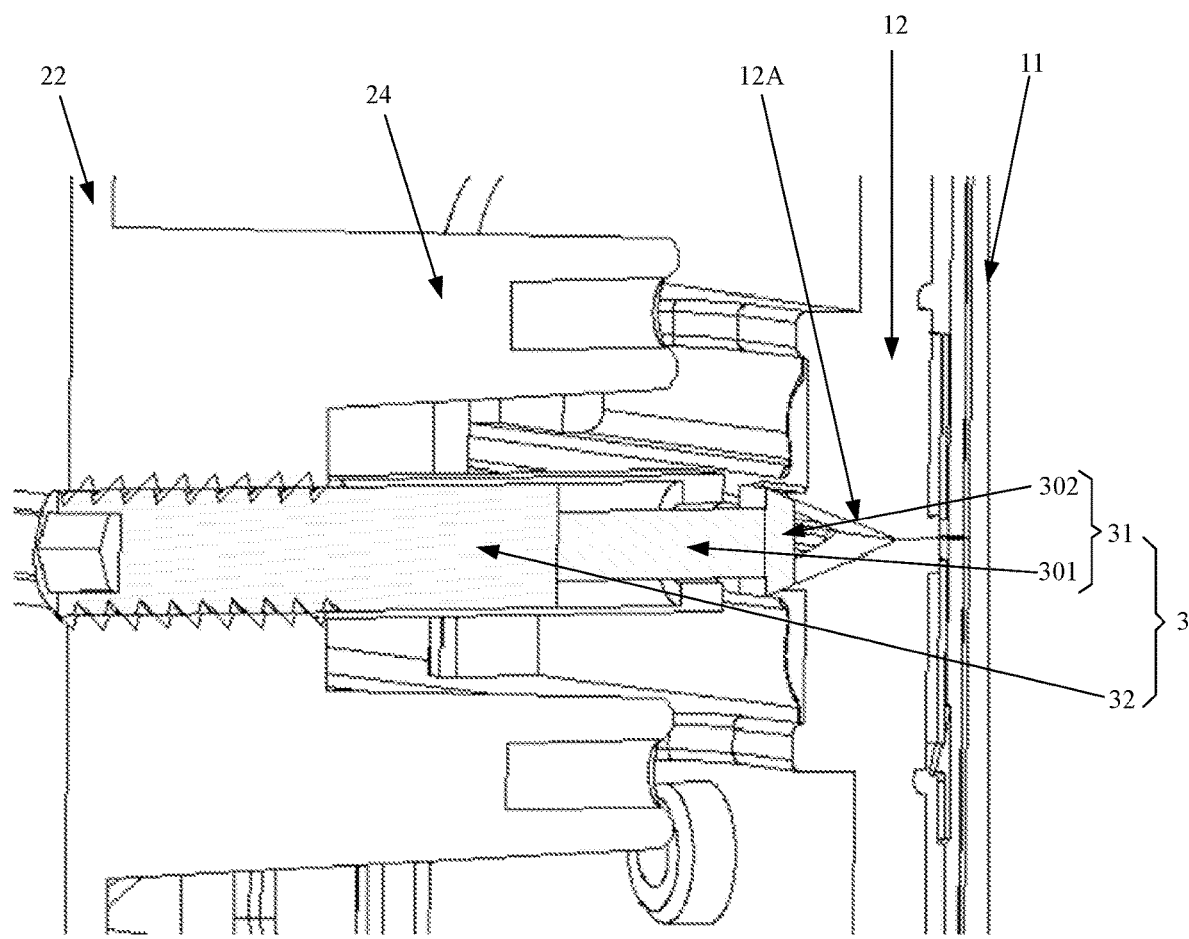
FIG. 8 is a partially enlarged view of area A in FIG. 7.

FIG. 4 is a schematic structural diagram of a sub-display panel component according to the embodiments of the present disclosure. FIG. 5 is a top view of a sub-display panel component according to the embodiments of the present disclosure. FIG. 6 is an exploded view of a sub-display panel component according to the embodiments of the present disclosure. FIG. 7 is a cross-sectional view of a seam adjustment structure component according to the embodiments of the present disclosure. FIG. 8 is a partially enlarged view of area A in FIG. 7, As shown in FIGS. 4 to 8, in some embodiments, a sub-display panel component 1 includes: a display substrate 11 and a fixing frame 12.

The display substrate 11 is fixed on a side of the fixing frame 12. The case body 2 includes a bottom plate 22 and a supporting structure 24, the supporting structure 24 is located on a side of the bottom plate 22, and is configured to bear the sub-display panel components 1, and the bottom plate 22 is disposed opposite to the sub-display panel components 1. The seam adjustment structure component 3 is located on the bottom plate 22 and is configured to be capable of contacting with the fixing frames 12 in the corresponding two adjacent sub-display panel components 1, so as to adjust a distance between the fixing frames 12 in the corresponding two adjacent sub-display panel components 1.

That is, in the embodiments of the present disclosure, by bringing the seam adjustment structure component 3 into contact with the fixing frames 12 in the corresponding two adjacent sub-display panel components 1, and adjusting the distance between the fixing frames 12 in the two adjacent sub-display panel components 1, an adjustment to the width of the splicing seam between the two adjacent sub-display panel components 1 is achieved.

In some embodiments, a substrate material of the display substrate 11 may be glass, Polyimide (PI), or other suitable materials.

In some embodiments, the sub-display panel component 1 of a splicing display device may be a liquid crystal sub-display panel component or an Organic Light-Emitting Diode (OLED) sub-display panel component, and in an embodiment, the sub-display panel component 1 is a micro inorganic light-emitting diode sub-display panel component.

In some embodiments, the seam adjustment structure component 3 is configured to be capable of moving along a normal direction of the bottom plate 22, and can be inserted into the space between the fixing frames 12 in the corresponding two adjacent sub-display panel components 1 and in contact with outer sidewalls 12A of the fixing frames 12 in the corresponding two adjacent sub-display panel components 1.

In the embodiments of the present disclosure, by inserting the seam adjustment structure component 3 into the space between the fixing frames 12 in the corresponding two adjacent sub-display panel components 1, and pressing the outer sidewalls 12A of the fixing frames 12 in the two adjacent sub-display panel components 1, the distance between the fixing frames 12 in the corresponding two adjacent sub-display panel components 1 is changed, thereby achieving adjustment of the distance between the fixing frames 12.

In some embodiments, the seam adjustment structure component 3 includes: an ejector rod 31, which includes: a rod body 301 and an insertion portion 302, the rod body 301 penetrates through the bottom plate 22, and the insertion portion 302 is fixed at an end of the rod body 301 close to the sub-display panel components 1. A cross-sectional area of a cross section of the insertion portion 302 parallel to the bottom plate 22 gradually increases along a direction approaching the rod body 301. Part of an outer sidewall of the insertion portion 302 is configured to be in contact with the outer sidewalls 12A of the fixing frames 12 in the corresponding two adjacent sub-display panel components 1.

Within a certain range (determined by a shape of the outer sidewall of the insertion portion 302 and shapes of the outer sidewalls 12A of the fixing frames 12 in the sub-display panel components 1), the deeper the insertion portion 302 is inserted into the space between the fixing frames 12 in the corresponding two adjacent sub-display panel components 1, the larger the distance between the fixing frames 12 in the corresponding two adjacent sub-display panel components 1.

Figure 9:
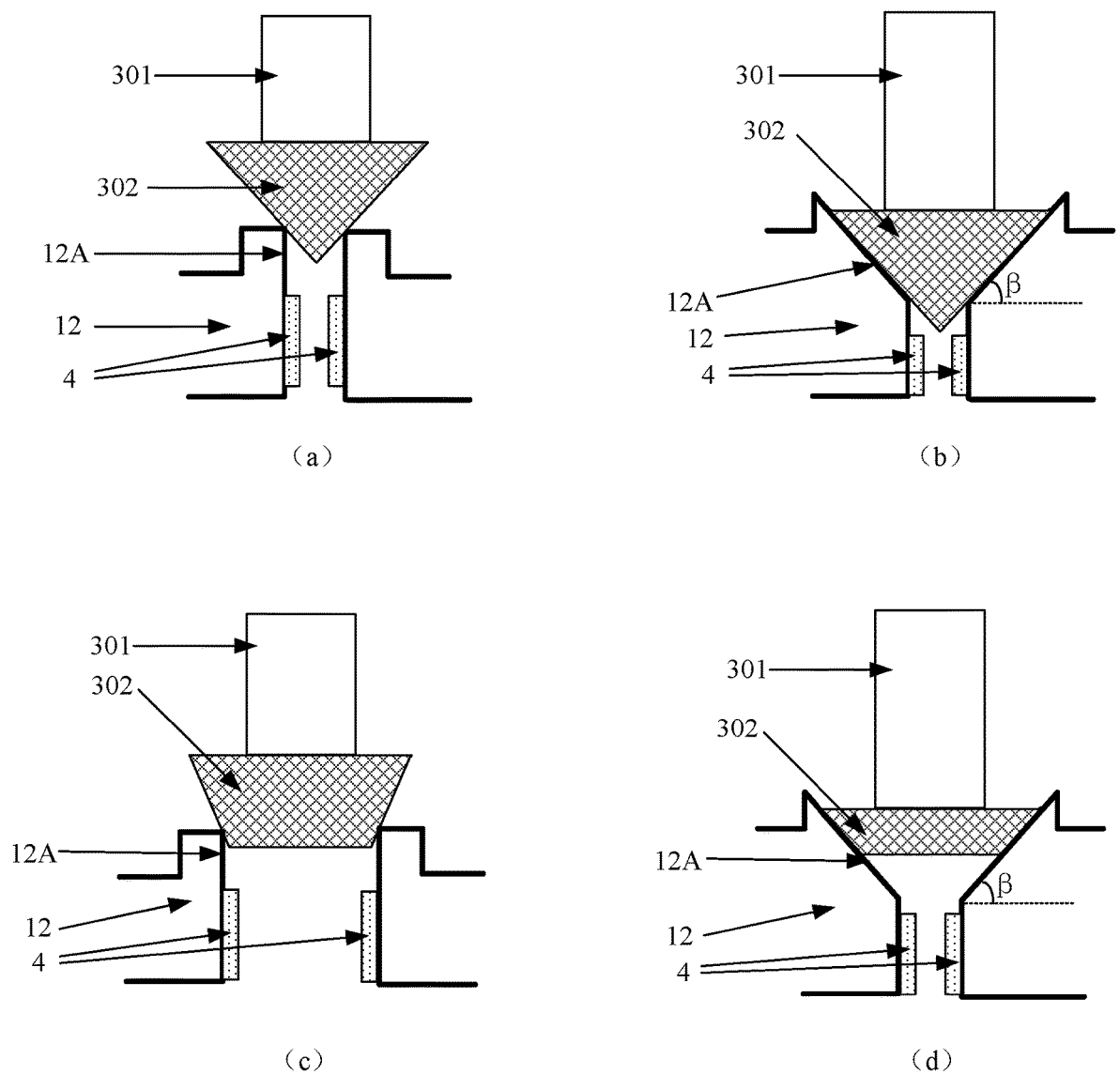
FIG. 9 is a schematic diagram showing various structures of different insertion portions and two fixing frames in contact with the insertion portion according to the embodiments of the present disclosure.

FIG. 9 is a schematic diagram illustrating various structures of different insertion portions and two fixing frames in contact therewith according to the embodiments of the present disclosure. As shown in FIG. 9, in some embodiments, a shape of a cross section of the insertion portion 302 perpendicular to the bottom plate 22 is a triangle (see the cases illustrated by (a) and (b) of FIG. 9) or an isosceles trapezoid (see the cases illustrated by (c) and (d) of FIG. 9). In some embodiments, part of the outer sidewall 12A of the fixing frame 12 in each sub-display panel component 1 configured to be in contact with the insertion portion 302 of the corresponding seam adjustment structure component 3 is a vertical surface (see the cases illustrated by (a) and (c) of FIG. 9) or a slope having an acute slope angle $\beta$ (see the cases illustrated by (b) and (b) of FIG. 9).

It should be noted that the cases illustrated by FIG. 9 are only for the purpose of illustration, and do not make any limitation to the technical solutions of the present disclosure. In the embodiments of the present disclosure, the shape of the cross section of the insertion portion 302 perpendicular to the bottom plate 22 may also be other shape (for example, the sides of the isosceles trapezoid in FIG. 9 is designed as curved sides), and the part of the outer sidewall 12A of the fixing frame 12 in each sub-display panel component 1 configured to be in contact with the insertion portion 302 of the corresponding seam adjustment structure component 3 may also be in other shapes (for example, the part of the outer sidewall configured to be in contact with the insertion portion 302 of the corresponding seam adjustment structure component 3 is designed as a curved surface). In the embodiments of the present disclosure, it only needs to be ensured that, within a certain range (designed according to actual needs), the deeper the insertion portion 302 is inserted into the space between the fixing frames 12 in the corresponding two adjacent sub-display panel components 1, the larger the distance between the fixing frames 12 in the corresponding two adjacent sub-display panel components 1.

In some embodiments, a shape of the insertion portion 302 is a cone, a quadrangular pyramid, a truncated cone, or a truncated quadrangular pyramid.

In some embodiments, the seam adjustment structure component 3 further includes: an insertion positioning structure 32, and a first limiting groove 23 is formed in the bottom plate 22 at a position corresponding to the seam adjustment structure component 3, and the first limiting groove 2 is configured to accommodate the insertion positioning structure 32 and limit the insertion positioning structure 32 at different depths. A via hole is formed at a bottom of the first limiting groove 23, the rod body 301 penetrates through the via hole, and the insertion positioning structure 32 is connected to an end of the rod body 301 away from the insertion portion 302.

In the embodiments of the present disclosure, the rod body 301 can be pushed by the insertion positioning structure 32 to move, so as to control an insertion depth of the insertion portion 302, thereby achieving control of the distance between the fixing frames 12 in the corresponding two adjacent sub-display panel components 1.

In an exemplary embodiment, when a width of a splicing seam between certain two adjacent sub-display panel components 1 needs to be increased, the rod body 301 may be pushed by the corresponding insertion positioning structure 32 to move toward the sub-display panel components 1, which increases the insertion depth of the insertion portion 302, so that the distance between the fixing frames 12 in the two adjacent sub-display panel components 1 is increased, thereby increasing the width of the splicing seam between the two adjacent sub-display panel components 1.

In another exemplary embodiment, when a width of a splicing seam between certain two adjacent sub-display panel components 1 needs to be reduced, the insertion positioning structure 32 may be partially drawn out from the first limiting groove 23 and fixed (limited and fixed by the first limiting groove 23). At this time, the following two cases may occur.

As a first case, the insertion positioning structure 32 is fixedly connected to the end of the rod body 301 away from the insertion portion 302, the insertion positioning structure 32 drives the rod body 301 to move toward a side away from the sub-display panel components 1, at this time the two adjacent sub-display panel components 1 may be appropriately pressed toward the splicing seam, so that the width of the splicing seam is continuously reduced until the fixing frames 12 in the two adjacent sub-display panel components 1 come into contact with the insertion portion 302.

As a first case, the insertion positioning structure 32 is connected to the end of the rod body 301 away from the insertion portion 302 in a non-fixed way, the end of the rod body 301 away from the insertion portion 302 is separated from the insertion positioning structure 32, at this time, the two adjacent sub-display panel components 1 may be appropriately pressed toward the splicing seam, and the fixing frames 12 in the two adjacent sub-display panel components 1 push the rod body 301 to move toward the side away from the sub-display panel components 1, so that the width of the splicing seam is continuously reduced until the end of the rod body 301 away from the insertion portion 302 comes into contact with the insertion positioning structure 32.

In some embodiments, the insertion positioning structure 32 includes an adjusting screw, and an internal thread matching an external thread of the adjusting screw is formed on an inner sidewall of the first limiting groove 23. That is, a length of a portion of the adjusting screw in the first limiting groove can be controlled by turning the adjusting screw, so that the insertion depth of the insertion portion 302 can be controlled.

In the embodiments of the present disclosure, the insertion depth of the insertion portion 302 can be precisely controlled by the adjusting screw. In addition, in a process of adjusting the insertion depth of the insertion portion 302 with the adjusting screw by an installer, the installer can also observe an adjustment effect of the splicing display device from the front at the same time.

Figure 10:
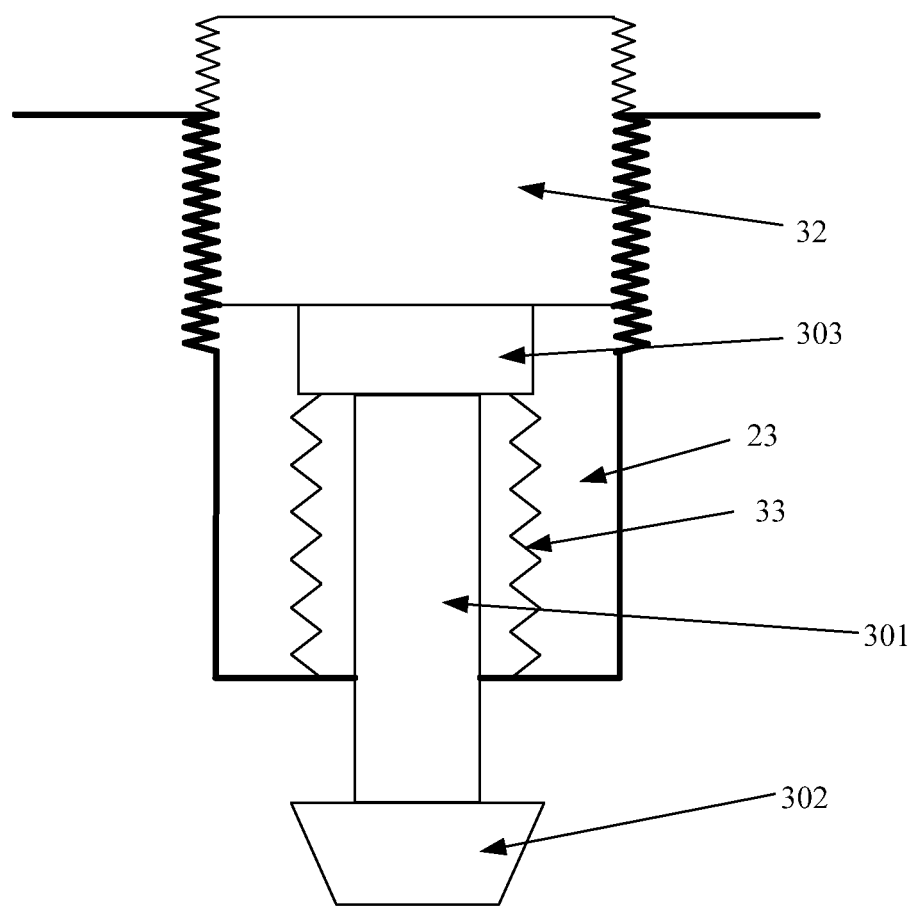
FIG. 10 is a schematic cross-sectional view of a seam adjustment structure component according to the embodiments of the present disclosure.

FIG. 10 is a cross-sectional view of a seam adjustment structure component according to the embodiments of the present disclosure. As shown in FIG. 10, in some embodiments, the ejector rod 31 further includes: a limiting portion 303 fixed at the end of the rod body 301 away from the insertion portion 302. The seam adjustment structure component 3 further includes: an elastic member 33 having one end connected to the limiting portion 303 and the other end connected to the bottom of the first limiting groove 23. The elastic member 33 is always kept in a compressed state. Thus, after the insertion positioning structure 32 is partially drawn out from the first limiting groove 23, even in the case where the insertion positioning structure 32 is connected to the end of the rod body 301 away from the insertion portion 302 in a non-fixed way, the limiting portion is always connected to the insertion positioning structure 32 under the action of the elastic member 33, that is, the rod body 301 can move along with the insertion positioning structure 32 toward the side away from the sub-display panel components 1, and then it is only required that the two adjacent sub-display panel components 1 are appropriately pressed toward the seam until the fixing frames 12 in the two adjacent sub-display panel components 1 come into contact with the insertion portion 302 as described in the first case.

In some embodiments, the adjusting screw has a diameter ranging from 3 mm to 5 mm, and a length ranging from 4 mm to 6 mm (a movement distance of the ejector rod 31 is from 4 mm to 6 mm); and the ejector rod 31 has a length ranging from 8 mm to 12 mm.

Based on the same inventive concept, the embodiments of the present disclosure further provide a splicing display device, including: a plurality of sub-display panel components and a bearing case, the bearing case may adopt the bearing case provided in the above embodiments, and reference may be made to the content in the above embodiments for a detailed description of the bearing case.

In some embodiments, one or more seam adjustment structure components 3 are provided for two adjacent sub-display panel components 1. That is, the width of the splicing seam between the two adjacent sub-display panel components 1 may be adjusted by the corresponding one or more seam adjustment structure components 3.

In some embodiments, any two adjacent sub-display panel components 1 are provided with a corresponding seam adjustment structure component 3. That is, the width of the splicing seam between any two adjacent sub-display panel components 1 can be adjusted by the corresponding seam adjustment structure component 3.

In some embodiments, the sub-display panel component 1 includes: a display substrate 11 and a fixing frame 12, and the display substrate 11 is fixed on a side of the fixing frame 12. The case body 2 includes a bottom plate 22 and a supporting structure 24, the supporting structure 24 is located on a side of the bottom plate 22, and is configured to bear the sub-display panel components 1, and the bottom plate 22 is disposed opposite to the sub-display panel components 1. The seam adjustment structure component 3 is located on the bottom plate 22 and is configured to be capable of contacting with the fixing frames 12 in the corresponding two adjacent sub-display panel components 1, so as to adjust a distance between the fixing frames 12 in the corresponding two adjacent sub-display panel components 1. In this case, one seam adjustment structure components 3 may be provided for two adjacent sub-display panel components 1, and the seam adjustment structure component 3 is located at a middle position between the fixing frames 12 in the corresponding two adjacent sub-display panel components 1.

With reference to FIG. 3, the splicing display device includes eight sub-display panel components 1-1 to 1-4 and 2-1 to 2-4 arranged in a 2×4 array along a first direction X and a second direction Y. Ten seam adjustment structure components 3 are provided for the eight sub-display panel components 1-1 to 1-4 and 2-1 to 2-4, and are respectively located in areas where Q1 to Q10 are located shown in FIG. 3. Here, any two adjacent sub-display panel components are provided with one corresponding seam adjustment structure component 3.

In an exemplary embodiment, as shown in FIG. 3, for the sub-display panel component 1-1 and the sub-display panel component 1-2 disposed adjacent to each other along the first direction X, the seam adjustment structure component 3 corresponding to the two sub-display panel components is located at a middle position Q1 between the fixing frames 12 of the two sub-display panel components, and the sub-display panel component 1-1 and the sub-display panel component 1-2 can be adjusted by the seam adjustment structure component 3 to slightly move along the first direction X, so as to adjust a width of a splicing seam between the sub-display panel component 1-1 and the sub-display panel component 1-2.

In another exemplary embodiment, as shown in FIG. 3, for the sub-display panel component 1-1 and the sub-display panel component 2-1 disposed adjacent to each other along the second direction Y, the seam adjustment structure component 3 corresponding to the two sub-display panel components is located at a middle position Q4 between the fixing frames 12 of the two sub-display panel components; and the sub-display panel component 1-1 and the sub-display panel component 2-1 can be adjusted by the seam adjustment structure component 3 to slightly move in the second direction Y, so as to adjust a width of a splicing seam between the sub-display panel component 1-1 and the sub-display panel component 2-1.

In some embodiments, a magnet 4 is disposed on an outer sidewall 12A of the fixing frame 12, and the magnets 4 disposed on outer sidewalls, opposite to each other, of the fixing frames 12 in the two adjacent sub-display panel components 1 have opposite magnetic poles. That is, the fixing frames 12 in the two adjacent sub-display panel components 1 attract each other through the magnets 4, so that the two fixing frames 12 can always press the insertion portion 302 (the fixing frames 12 in the two adjacent sub-display panel components 1 are automatically pulled toward the seam) when the insertion portion 302 of the corresponding seam adjustment structure component 3 is inserted into the space between the two fixing frames 12.

With reference to FIG. 6, in some embodiments, the splicing display device further includes: a first circuit board 6 located on a side of the fixing frame 12 away from the display substrate 11, and the first circuit board 6 is movably connected to the fixing frame 12. The first circuit board 6 has a first connection port 61.

In addition, the splicing display device further includes: a second circuit board (not shown) fixed on a mounting surface (not shown) of the case body 2, and the second circuit board is fixedly connected to the first circuit board 6. For example, the second circuit board may be a multi-port repeater.

The first circuit board 6 is configured to transmit a data signal to the sub-display panel component 1 to generate an image displayed by the sub-display panel component 1. Specifically, the sub-display panel component 1 includes three flexible circuit boards FPC1, FPC2, FPC3 disposed on a non-display side of the display substrate 11, and a first wiring terminal 62, a second wiring terminal 63, and a third wiring terminal 64 in the first circuit board 6 are electrically connected to FPC1, FPC2, FPC3, respectively. The fixing frame 12 is configured to fix the display substrate 11, that is, the fixing frame 12 and the display substrate 11 are fixedly mounted. The first circuit board 6 is electrically connected to the second circuit board, and the second circuit board can supply a data signal to the display substrate 11 in the sub-display panel component 1 through the first circuit board 6. The fixing frame 12 is movably connected to the first circuit board 6, so as that the first circuit board is movably connected to the display substrate 11.

It should be noted that the second circuit board is provided thereon with a second connection port fixedly connected to the first connection port 61 of the first circuit board 6. The second circuit board may be located on a side, away from the second connection port, of a structural panel on which the second connection port is located.

In some embodiments, the first circuit board 6 may be a Printed Circuit Board (PCB), and a material of the fixing frame 12 may be die-cast aluminum, an aluminum alloy, or other suitable material.

The first circuit board 6 includes: at least one second limiting groove 131. The fixing frame 12 is provided with: at least one second positioning column 135, at least one third threaded hole 136, and at least one fixing hole 132. The number of the second limiting grooves 131 is the same as the sum of the number of the second positioning columns 135 and the number of the third threaded holes 136. The second positioning columns 135 are configured to be fit with some second limiting grooves 131 to achieve assembly alignment of the first circuit board 6 with the fixing frame 12. Each of the remaining second limiting grooves 131 is connected to one third threaded hole 136 through a threaded connector 133 to achieve assembly fixation of the first circuit board 6 to the fixing frames 12. The threaded connector 133 includes a spring washer 134.

In some embodiments, the second limiting groove 131 of the first circuit board 6 and the third threaded hole 136 of the fixing frame 12 are connected through a bolt and a nut, with a spring washer 134 disposed between the bolt and the nut, and the spring washer 134 may buffer the connection between the first circuit board 6 and the fixing frame 12. The spring washer 134 may be a compression spring.

Each sub-display panel component 1 further includes: a ferromagnetic sheet 8. The sub-display panel component can be separated from the bearing case by a magnetic electrostatic chuck when the sub-display panel component in the splicing display device is detached. The ferromagnetic sheet 8 is provided with at least one mounting hole 137 in one-to-one correspondence with the at least one fixing hole 132 of the fixing frame 12, and assembly connection of the ferromagnetic sheet 8 and the fixing frame 12 is achieved using the fixing hole(s) 132 and the mounting hole(s) 137 by a fixing member (such as a screw).

The case body 2 is divided into a plurality of mounting areas in one-to-one correspondence with the plurality of sub-display panel components 1, and each mounting area is provided therein with a corresponding mounting surface. An assembling process of the sub-display panel components 1 and the case body 2 is substantially as follows.

For each sub-display panel component 1, before the sub-display panel component 1 is fixedly mounted in the corresponding mounting area of the case body 2, the first circuit board 6 connected to each sub-display panel component 1 needs to be assembled at first. In some embodiments, a part of the second limiting grooves 131 of the first circuit board 6 are engaged with the second positioning columns 135 of the fixing frame 12 of the sub-display panel component 1 (that is, the second positioning columns 135 are inserted into the corresponding second limiting grooves 131), and the remaining second limiting grooves 131 of the first circuit board 6 are connected to the third threaded holes 136 of the fixing frame 12 of the sub-display panel component 1 through the bolts and the nuts, and at this time, the bolts and the nuts may be preliminarily fastened as long as the connection between the sub-display panel component 1 and the first circuit board 6 is achieved. Since the second limiting groove has an oblique design and a cross-sectional area of the second limiting groove is greater than cross-sectional areas of the bolt, the nut, and the second positioning column, the bolt, the nut, and the second positioning column can slide along a groove body in which they are located, that is, relative movement along the groove bodies of the second limiting grooves 131 can be achieved between the sub-display panel component 1 and the first circuit board 6.

Next, the sub-display panel component 1 assembled with the first circuit board 6 and the case body 2 are assembled, and the first connection port 61 of the first circuit board 6 is fixedly connected to the second connection port of the second circuit board provided on the case body 2.

Then, the width of the splicing seam between two adjacent sub-display panel components 1 are adjusted by the corresponding seam adjustment structure component 3. In the adjustment process, since the fine-adjusting structure component is located on the fixing frame 12 and the display substrate 11 is movably connected to the first circuit board 6, fine adjustment of the sub-display panel component 1 does not affect the electrical connection between the first circuit board 6 and the second circuit board.

In some embodiments, the fixing frame 12 of the sub-display panel component 1 is provided with tacks 82 on a side facing the case body 2, and a plurality of magnetic structures 81 are correspondingly provided on the mounting surface in the area of the case body 2 corresponding to each sub-display panel component 1. For example, in a case illustrated by FIGS. 4 and 5, six tacks 82 are provided on each sub-display panel component 1, and eight magnetic structures 81 are provided in the corresponding area of the case body 2. A material of the tacks 82 may include a ferromagnetic metal or a ferromagnetic alloy, such as iron, nickel, cobalt, galvanized iron, or stainless iron. Since the magnetic structures 81 have magnetism, the magnetic structures can provide a magnetic attraction force to the sub-display panel provided with the tacks. It should be understood that, in consideration of an assembly tolerance and a dimensional tolerance of workpiece, a distance of no more than 0.3 mm may exist between the magnetic structure 81 and the tack 82 in a normal direction of the display substrate after the sub-display panel component 1 is mounted on the case body 2. The magnetic structures 81 in the case body 2 can provide reliable attraction forces to every sub-display panel component 1, so that the splicing display device has a high reliability.

It should be noted that the relational terms such as "first" and "second" herein are only used to distinguish one entity or action from another entity or action, but do not necessarily require or imply that such relationship or order actually exists between those entities or actions. Moreover, the terms "include", "comprise" or any other variation thereof are intended to indicate a non-exclusive inclusion, so that a process, method, article, or device, which includes a series of elements, does not only include those elements but also include other elements which are not explicitly listed, or the elements inherent in such process, method, article, or device. If there are no more limitations, limiting an element by "including a . . . " does not exclude the existence of other identical elements in the process, method, article, or device which includes the element.

The embodiments of the present disclosure described above do not describe all details, and do not limit the present disclosure to the described specific embodiments either. Apparently, various modifications and changes can be made according to the above description. The embodiments chosen and described in detail herein are intended to better explain principles and practical applications of the present disclosure, so as to enable those of ordinary skill in the art to well apply the present disclosure, and enable modification and applications based on the present disclosure. The present disclosure is only limited by the appended claims, a full scope of the claims, and equivalents thereof.

What is claimed is:

1. A bearing case, comprising:
a case body configured to bear a plurality of sub-display panel components; and
at least one seam adjustment structure component each corresponding to two adjacent sub-display panel components, wherein each seam adjustment structure component is connected to the case body, and is configured to adjust a width of a splicing seam between the corresponding two adjacent sub-display panel components;
wherein each of the plurality of sub-display panel components comprises: a display substrate and a fixing frame, and the display substrate is fixed on a side of the fixing frame; wherein the case body comprises a bottom plate opposite to the plurality of sub-display panel components;
wherein the seam adjustment structure component comprises: an ejector rod comprising: a rod body and an insertion portion, the rod body penetrates through the bottom plate, and the insertion portion is fixed at an end of the rod body close to the sub-display panel components;
a cross-sectional area of a cross section of the insertion portion parallel to the bottom plate gradually increases along a direction approaching the rod body; and
part of an outer sidewall of the insertion portion is configured to be in contact with the outer sidewalls of the fixing frames in the corresponding two adjacent sub-display panel components.

2. The bearing case of claim 1, wherein the case body further comprises a supporting structure, and the supporting structure is on a side of the bottom plate, and is configured to bear the plurality of sub-display panel components; and
the seam adjustment structure component is on the bottom plate and is configured to be capable of contacting with fixing frames in the corresponding two adjacent sub-display panel components, so as to adjust a distance between the fixing frames in the corresponding two adjacent sub-display panel components.

3. The bearing case of claim 2, wherein the seam adjustment structure component is configured to be capable of moving along a normal direction of the bottom plate, being inserted into space between the fixing frames in the corresponding two adjacent sub-display panel components, and contacting with outer sidewalls of the fixing frames in the corresponding two adjacent sub-display panel components.

4. The bearing case of claim 1, wherein a cross-sectional shape of a cross section of the insertion portion perpendicular to the bottom plate is an isosceles trapezoid.

5. The bearing case of claim 1, wherein a shape of the insertion portion is a cone, a quadrangular pyramid, a truncated cone, or a truncated quadrangular pyramid.

6. The bearing case of claim 1, wherein the seam adjustment structure component further comprises: an insertion positioning structure, and a first limiting groove is formed in the bottom plate at a position corresponding to the seam adjustment structure component, and the first limiting groove is configured to accommodate the insertion positioning structure and limit the insertion positioning structure at different depths; and
a via hole is formed at a bottom of the first limiting groove, the rod body penetrates through the via hole, and the insertion positioning structure is connected to an end of the rod body away from the insertion portion.

7. The bearing case of claim 6, wherein the ejector rod further comprises: a limiting portion fixed at the end of the rod body away from the insertion portion;
the seam adjustment structure component further comprises: an elastic member; and
the elastic member has one end connected to the limiting portion and the other end connected to the bottom of the first limiting groove.

8. The bearing case of claim 6, wherein the insertion positioning structure comprises an adjusting screw, and an internal thread matching an external thread of the adjusting screw is formed on an inner sidewall of the first limiting groove.

9. The bearing case of claim 8, wherein the adjusting screw has a diameter ranging from 3 mm to 5 mm, and a length ranging from 4 mm to 6 mm; and the ejector rod has a length ranging from 8 mm to 12 mm.

10. A splicing display device, comprising: a plurality of sub-display panel components and the bearing case of claim 1.

11. The splicing display device of claim 10, wherein one or more seam adjustment structure components are provided for two adjacent sub-display panel components.

12. A splicing display device, comprising: a plurality of sub-display panel components and a bearing case, wherein the bearing case comprises:
a case body configured to bear a plurality of sub-display panel components; and
at least one seam adjustment structure component each corresponding to two adjacent sub-display panel components, wherein each seam adjustment structure component is connected to the case body, and is configured to adjust a width of a splicing seam between the corresponding two adjacent sub-display panel components; and
any two adjacent sub-display panel components are provided with a corresponding seam adjustment structure component;
wherein each of the plurality of sub-display panel components comprises: a display substrate and a fixing frame, and the display substrate is fixed on a side of the fixing frame;
wherein the case body comprises a bottom plate opposite to the plurality of sub-display panel components;
wherein the seam adjustment structure component comprises: an ejector rod comprising:
a rod body and an insertion portion, the rod body penetrates through the bottom plate, and the insertion portion is fixed at an end of the rod body close to the sub-display panel components;
a cross-sectional area of a cross section of the insertion portion parallel to the bottom plate gradually increases along a direction approaching the rod body; and
part of an outer sidewall of the insertion portion is configured to be in contact with the outer sidewalls of the fixing frames in the corresponding two adjacent sub-display panel components.

13. A splicing display device, comprising: a plurality of sub-display panel components and a bearing case, wherein the bearing case comprises:
a case body configured to bear a plurality of sub-display panel components; and
at least one seam adjustment structure component each corresponding to two adjacent sub-display panel components, wherein each seam adjustment structure component is connected to the case body, and is configured to adjust a width of a splicing seam between the corresponding two adjacent sub-display panel components;
wherein each of the plurality of sub-display panel components comprises: a display substrate and a fixing frame, and the display substrate is fixed on a side of the fixing frame;
the case body comprises a bottom plate and a supporting structure, the supporting structure is on a side of the bottom plate, and is configured to bear the plurality of sub-display panel components, and the bottom plate is opposite to the plurality of sub-display panel components;
the seam adjustment structure component is on the bottom plate and is configured to be capable of contacting with fixing frames in the corresponding two adjacent sub-display panel components, so as to adjust a distance between the fixing frames in the corresponding two adjacent sub-display panel components;
one seam adjustment structure component is provided for the two adjacent sub-display panel components, and the seam adjustment structure component is located at a middle position between the fixing frames in the corresponding two adjacent sub-display panel components; and
wherein a magnet is disposed on an outer sidewall of each fixing frame, and the fixing frames in the two adjacent sub-display panel components attract each other through the magnets.

14. The splicing display device of claim 10, wherein each of the plurality of sub-display panel components comprises: a display substrate and a fixing frame, and the display substrate is fixed on a side of the fixing frame;
the case body comprises a bottom plate and a supporting structure, the supporting structure is on a side of the bottom plate, and is configured to bear the plurality of sub-display panel components, and the bottom plate is opposite to the plurality of sub-display panel components;
the seam adjustment structure component is on the bottom plate and is configured to be capable of contacting with fixing frames in the corresponding two adjacent sub-display panel components, so as to adjust a distance between the fixing frames in the corresponding two adjacent sub-display panel components;
the seam adjustment structure component is configured to be capable of moving along a normal direction of the bottom plate, being inserted into space between the fixing frames in the corresponding two adjacent sub-display panel components, and contacting with outer sidewalls of the fixing frames in the corresponding two adjacent sub-display panel components;
the seam adjustment structure component comprises: an ejector rod comprising: a rod body and an insertion portion, the rod body penetrates through the bottom plate, and the insertion portion is fixed at an end of the rod body close to the sub-display panel components;
a cross-sectional area of a cross section of the insertion portion parallel to the bottom plate gradually increases along a direction approaching the rod body;
part of an outer sidewall of the insertion portion is configured to be in contact with the outer sidewalls of the fixing frames in the corresponding two adjacent sub-display panel components; and
part of the outer sidewall of the fixing frame in each sub-display panel component configured to contact with the insertion portion of the corresponding seam adjustment structure component is a slope, and a slope angle of the slope is an acute angle.

* * * * *